(12) United States Patent
Aita et al.

(10) Patent No.: US 6,864,475 B1
(45) Date of Patent: Mar. 8, 2005

(54) IMAGE SENSOR HAVING UNIFORM SENSITIVITY

(75) Inventors: Kazuo Aita, Tokyo (JP); Takashi Terada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/562,460

(22) Filed: May 2, 2000

(30) Foreign Application Priority Data

Nov. 8, 1999 (JP) .......................................... 11-317061

(51) Int. Cl.⁷ .............................................. H01L 27/00
(52) U.S. Cl. ................................... 250/208.1; 250/226
(58) Field of Search ............................. 250/226, 208.1, 250/234, 235; 358/515, 540, 513, 514, 482, 406; 257/290, 291

(56) References Cited

U.S. PATENT DOCUMENTS

| | | | |
|---|---|---|---|
| 5,537,229 A | * 7/1996 | Brandestini et al. | 358/509 |
| 5,612,794 A | * 3/1997 | Brandestini et al. | 358/505 |
| 5,856,879 A | * 1/1999 | Suzuki et al. | 359/210 |
| 6,094,281 A | * 7/2000 | Nakai et al. | 358/512 |
| 6,147,343 A | * 11/2000 | Christensen | 250/234 |
| 6,157,027 A | * 12/2000 | Watanabe et al. | 250/234 |
| 6,376,822 B1 | * 4/2002 | Fujimoto et al. | 250/208.1 |
| 6,512,604 B1 | * 1/2003 | Machida et al. | 358/513 |

FOREIGN PATENT DOCUMENTS

| | | |
|---|---|---|
| JP | 6262101 | 12/1987 |
| JP | 06-112453 A | 4/1994 |
| JP | 7-147620 | * 6/1995 |
| JP | 9-289563 A | 11/1997 |
| JP | 11-97662 A | 4/1999 |
| JP | 11-154741 A | 6/1999 |
| JP | 11-214664 A | 8/1999 |
| JP | 11-238866 A | 8/1999 |

* cited by examiner

Primary Examiner—Que T. Le
(74) Attorney, Agent, or Firm—Rothwell, Figg, Ernst & Manbeck

(57) ABSTRACT

There are provided a plurality of light sources for applying light beams of red, green, and blue to a document surface. An optical system condenses light that is reflected from the document surface. A plurality of sensors are provided in the image formation section of the optical system, and read an image of the document. A reading device scans the sensors at a predetermined cycle in synchronism of lighting of the light sources. The wavelengths of the light sources are preferably 480 nm, 545 nm, and 640 nm or their vicinities. Information of the image is read out as serial electrical signals corresponding to the respective wavelengths.

1 Claim, 10 Drawing Sheets

Background Art

Background Art

Fig.8  Background Art

IMAGE SENSOR HAVING UNIFORM SENSITIVITY

BACKGROUND OF THE INVENTION

1. Field of the Invention

The present invention relates to an image sensor. In particular, the invention relates to an image sensor that is used in facsimile machines, copiers, scanners, etc. And detects, with sensors, light that is reflected from a document surface to be read.

2. Background Art

A conventional example of the above type of apparatus is a contact type image sensor that reads information on a document with a line sensor array having same length as the document by forming an image of the document in an actual size through one to one imaging of the document pixels.

Figure 4:
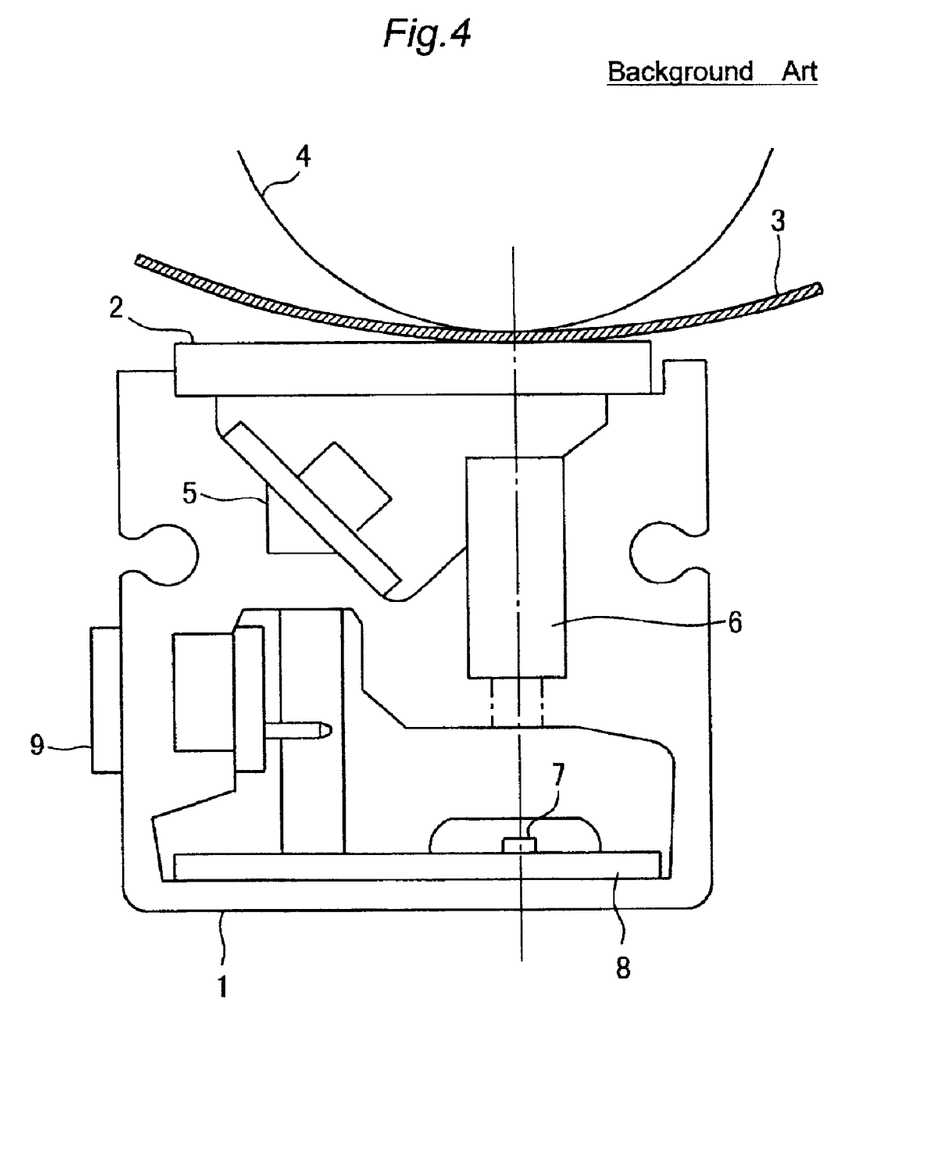
FIG. 4 is a sectional view showing an entire configuration of a conventional image sensor.

FIG. 4 is a sectional view of a conventional contact type image sensor that is disclosed in Japanese Unexamined Patent Publication No. Hie 7-147620, for example.

In FIG. 4, reference numeral 1 denotes a chassis having a sealed structure, and reference numeral 2 denotes a glass plate that is a transparent member disposed on the top surface of the chassis 1. The glass plate 2 not only transmits light coming from a light source (described later) but also holds a document to be read and prevents foreign matter from entering the chassis 1. Reference numeral 3 denotes a document that is held on the glass plate 2 and on which characters, image information, etc. including color ones are written. Reference numeral 4 denotes a platen for transporting the document 3 by rotating while pressing the document 3 against the glass plate 2. Reference numeral 5 denotes a light source provided in the chassis 1. The light source 6 is a collection of document illumination light sources having. respective spectral radiation energy distributions of red, green, or blue; for example, the light source 5 is an LED array in which red, green, and blue light-emitting diode (LED) chips are mounted on the same circuit board. The light source 5 applies light to the surface of the document 3 to be read via the glass plate 2. Reference numeral 6 denotes an erect-image, 1:1 magnification lens such as a rod lens array that is disposed below the glass plate 2 and condenses light that is reflected from the surface of the document 3 to be read. Reference numeral 7 denotes line sensor lCs that are solid-state imaging devices for imaging an image of the document 3 by detecting light that is condensed by the erect-image, 1:1 magnification lens 6. Reference numeral 8 denotes a sensor circuit board that is mounted with a plurality of line sensor ICs 7 arranged in line. Reference numeral 9 denotes a connector for input/output transfer of image readout information of the document 3 as well as power, signals, etc.

Next, a description will be made of an operation of the image sensor having the above configuration in reading a color image on the document 3.

Figure 5:
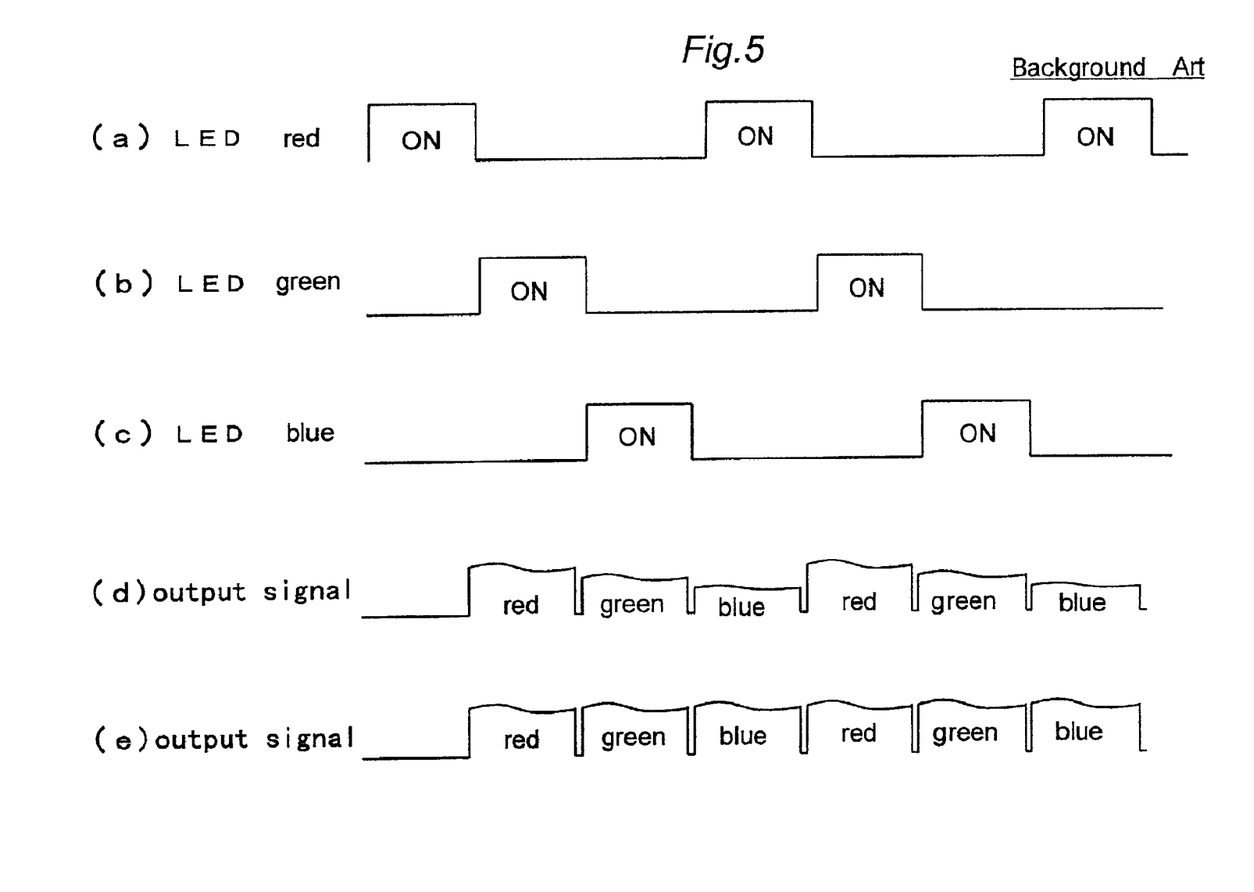
FIGS. 5A–5D show a timing relationship between on-state of light sources and output signals in the conventional image sensor.
FIG. 5E shows an output signal of a line sensor IC according to the second embodiment.

FIGS. 5A–5D show a relationship between on-state periods of the red, green, and blue light sources 5 respectively (FIGS. 5A–5C) and an output signal of one of the line sensor ICs 7 (FIGS. 5D).

As is well known, each line sensor IC 7, that is a solid-state imaging device such as a CCD or a photodiode array, operates in an accumulation mode. That is, many photodiodes constituting a photodiode array as a line sensor accumulates charges while a red, green, or blue light source is on-state, and outputs signals after the end of the on-state of the light source. Specifically, as shown in FIG. 5D, a red output signal is output when an on-state of the red light source has finished as shown in FIG. 5A and the next light source, that is, the green light source, is on as shown in FIG. 5B.

Similarly, a green output signal is output when an on-state of the green light source has finished and charges have been accumulated during the on-period of the green light source shown in FIG. 5B and the next light source, that is, the blue light source is in an on-state as shown in FIG. 5C.

A time series output signal is produced as shown in FIG. 5D in such a manner that signals of the respective colors are sequentially output after the ends of the respective on-periods.

Figure 6:
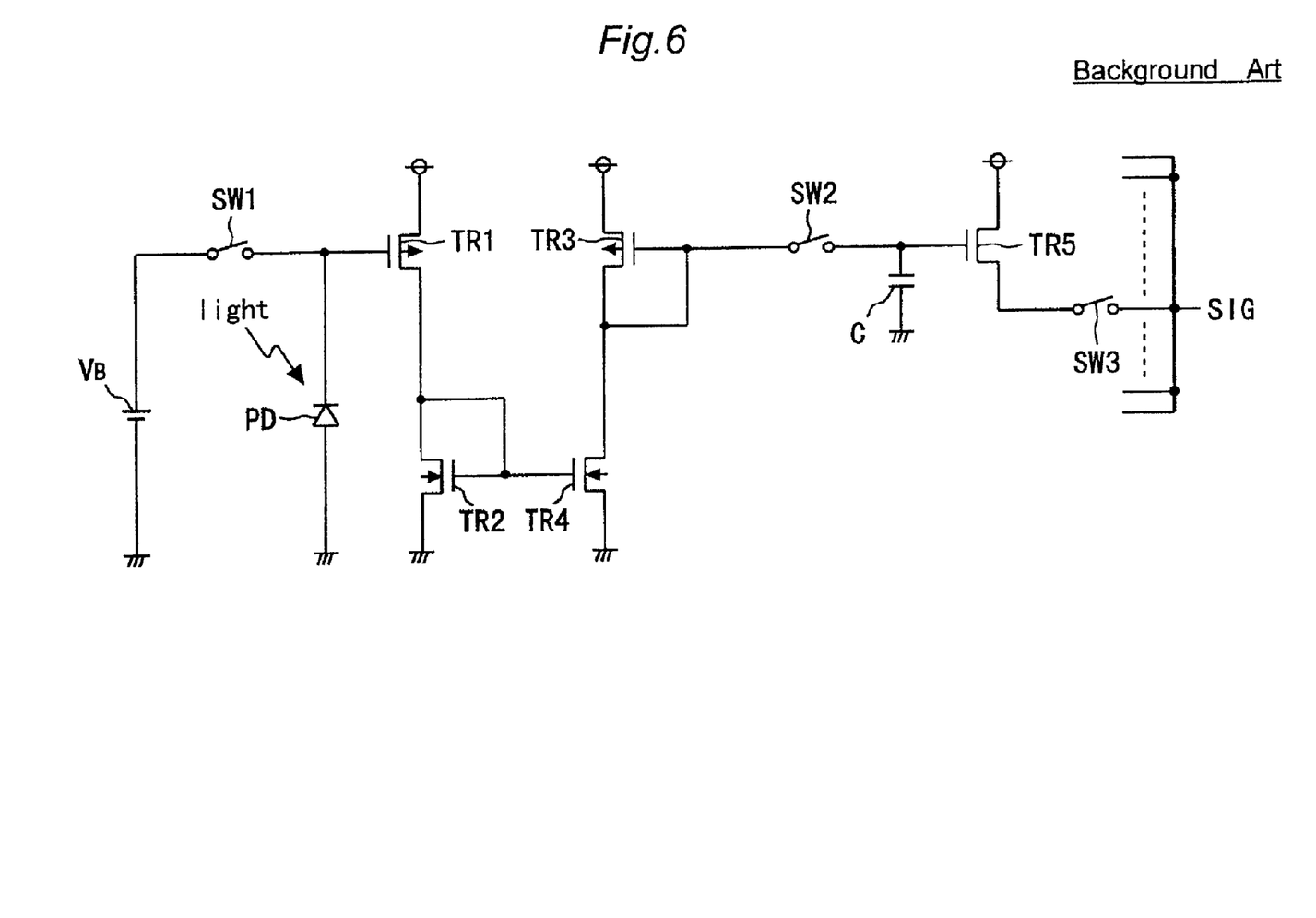
FIG. 6 is a circuit diagram showing a one-bit configuration of a sensor IC of the conventional image sensor.

FIG. 6 shows a one-bit circuit configuration of a line sensor IC 5 that produces an output signal as shown in FIG. 5D.

In FIG. 6, reference symbol VB denotes a bias voltage generator, PD denotes an optical sensor, and SW1 denotes a switch that supplies the optical sensor PD with a voltage that is generated by the bias voltage generator VB. The optical sensor PD is initialized while the switch SW1 is on.

Reference symbols TR1-TR4 denote transistors that constitute a current mirror circuit for transmitting an output voltage of the optical sensor PD. A terminal voltage of the optical sensor PD is output to the gate electrode of the transistor TR1. Reference symbol SW2 denotes a switch that is part of an accumulation circuit for the optical sensor PD. While the switch SW2 is on, it transmits a gate electrode voltage of the transistor TR3 to a capacitor C and charge is accumulated there in a concentrated manner. Reference symbol TR5 denotes a transistor for outputting a voltage that has developed across the capacitor C as a result of the charge accumulation. As described above, the transistor TR5 is kept on and a current is output to a SIG terminal during an on-state period of the light source of the next color.

Reference symbol SW3 denotes a switch for supplying an output of each bit to the SIG terminal. The switch SW3 is so controlled as to prevent shooting of the output of each bit.

In the conventional image sensor having the above configuration, a red signal, that is a signal accumulated by a reflected light during a red light illumination of the document, can be taken out by readout scanning while the following green light is in an on-state. Similarly, a green signal can be taken out by readout scanning while the blue light source is on, and a blue signal can be taken out by readout scanning while the red light source is on. The red, green, and blue signals thus taken out are arranged in time-series as shown in FIG. 5D. At this time, it is desirable that the red, green, and blue signal outputs be uniform when the same white document is read. However, actually there are large variations among signal outputs of the respective colors and hence a compensating means for equalizing the signal levels is necessary.

There are other problems that high-speed reading requires amplification of the respective outputs by an image processing circuit because the absolute values of the respective signals are small, and that the amplification increases the above-mentioned variations among signals of the respective colors.

Figure 7:
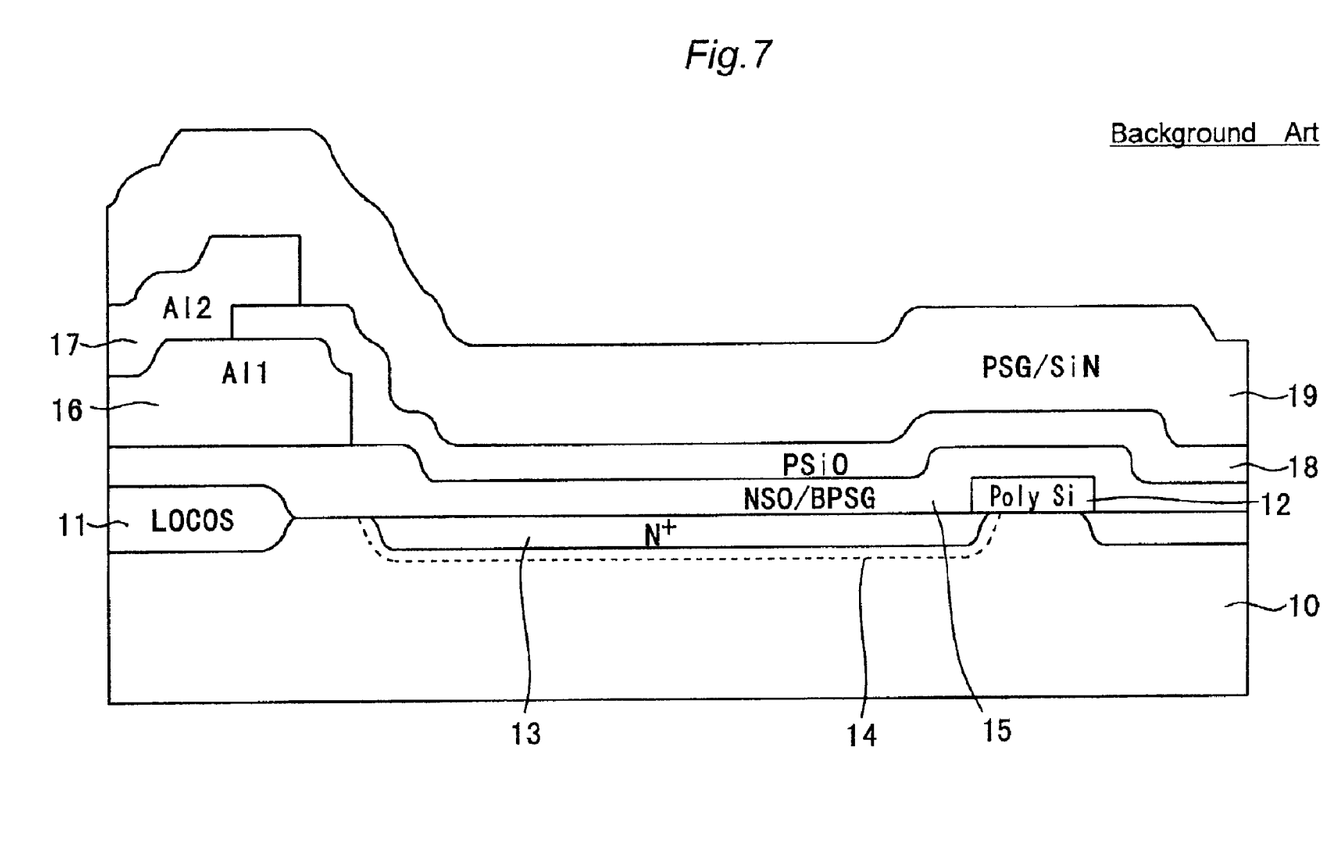
FIG. 7 is a sectional view showing a structure of a conventional line sensor IC.

One cause of the above problems is that the spectral sensitivity characteristic of the line sensor ICs 7 is not uniform. This point will be described below in detail.

FIG. 7 is a sectional view showing an example structure of a line sensor IC formed by using a semiconductor process.

In FIG. 7, reference numeral 10 denotes a p-type semiconductor substrate; 11, a LOCOS layer formed locally on the semiconductor substrate 10; 12, a polysilicon layer formed on the semiconductor substrate 10 so as to be separated from the LOCOS layer 11; 13, a n⁺ sensor portion formed by implanting a n-type impurity into a portion of the substrate 10 that is located between the LOCOS layer 11 and the polysilicon layer 12; and 14, a depletion layer formed along the n⁺ sensor portion 13. The depletion layer 14 includes space charge and generates a resulting strong electric field. Reference numeral 15 denotes a silicon borate/phosphate film (NSO/BPSG oxide film) formed on the top surfaces of the LOCOS layer 11, the polysilicon layer 12, and the n⁺ sensor portion 13 so as to cover those layers; 16, a first aluminum interconnection layer formed on part of the top surface of the silicon borate/phosphate film 15; 17, a second aluminum interconnection layer formed on the top surface of the first aluminum interconnection layer 16; 18, a plasma silicon oxide film (PSio film) formed on the top surfaces of the silicon borate/phosphate film 15 and the first aluminum interconnection layer 16; and 19, a protective film that is a silicon nitride film (PSG/SiN film) formed on the top surfaces of the plasma silicon oxide film 18 (PSiO film) and the second aluminum interconnection layer 17.

In the line sensor IC having the above structure, light is applied from above the protective film 19 and the n⁺ sensor portion 13 and the depletion layer 14 receive the light and produces electromotive force.

Figure 8:
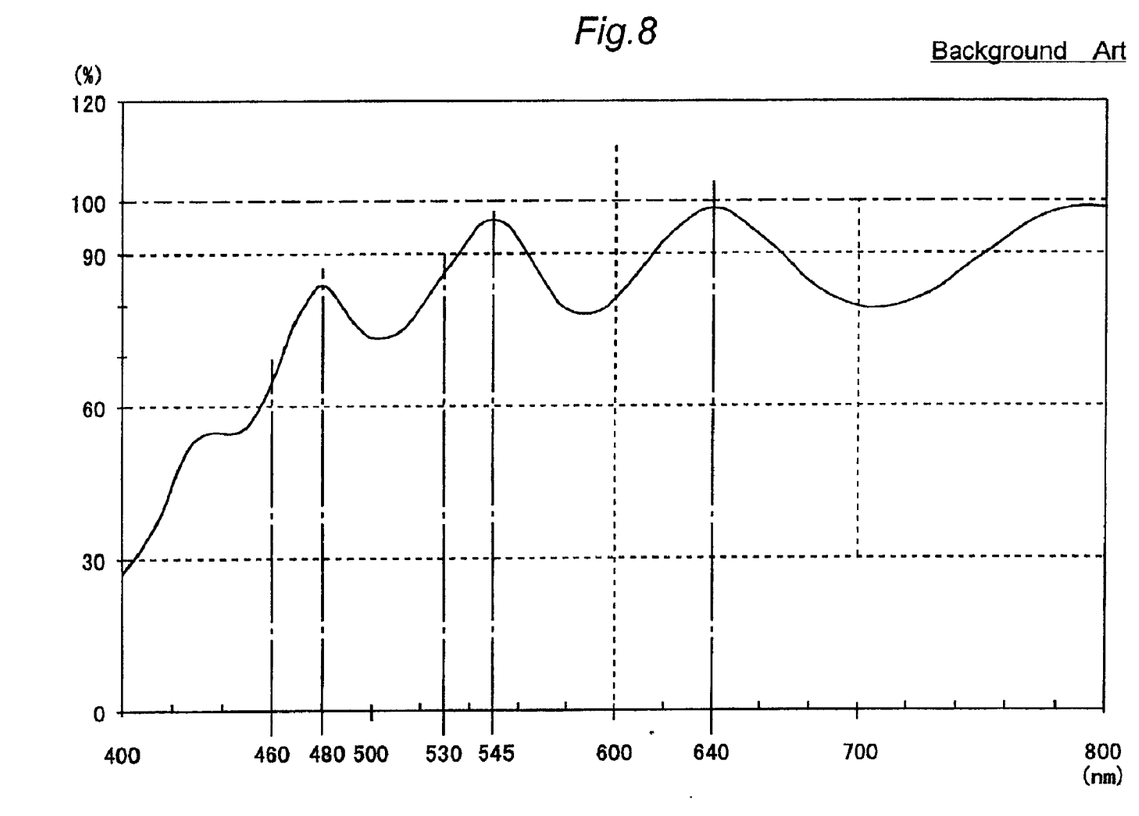
FIG. 8 shows a transmission spectrum of a protective film of the conventional line sensor IC.

The protective film 19 is formed at a thickness of about 8,000 Å, and FIG. 8 shows a transmission spectrum of the protective film 19 having such a thickness. The horizontal axis represents the wavelength and the vertical axis represents the transmittance.

As is apparent from FIG. 8, the transmittance decreases (the degree of absorption increases) as the wavelength shortens. In addition to the decrease in transmittance, there are undulations due to interference. With this transmission spectrum, if the wavelengths of the red, green, and blue light sources are selected arbitrarily, for example, if they are 640 nm (red), 530 nm (green), and 460 nm (blue) that are the wavelengths of LEDs available on the market, the corresponding transmittance values are 98% (red), 85% (green), and 65% (blue). These differences in transmittance cause differences among output signals, that is, variations among outputs of the respective colors, of the image sensor.

Further, in an ordinary semiconductor process, the thickness of the protective film 19 has dispersion of about ±20%. This causes a variation of the transmission spectrum, which in turn causes a lot-by-lot sensitivity variation. The peak wavelengths of the respective colors are 640 nm, 545 nm, and 480 nm.

The reason for small absolute values of output signals, that is, low sensitivities, is that because the layers above the n+ sensor portion 13 have different refractive indices, incident light is reflected at the boundaries between those layers and does not reach the n+ sensor portion 13 and the depletion layer 14 efficiently.

Figure 9:
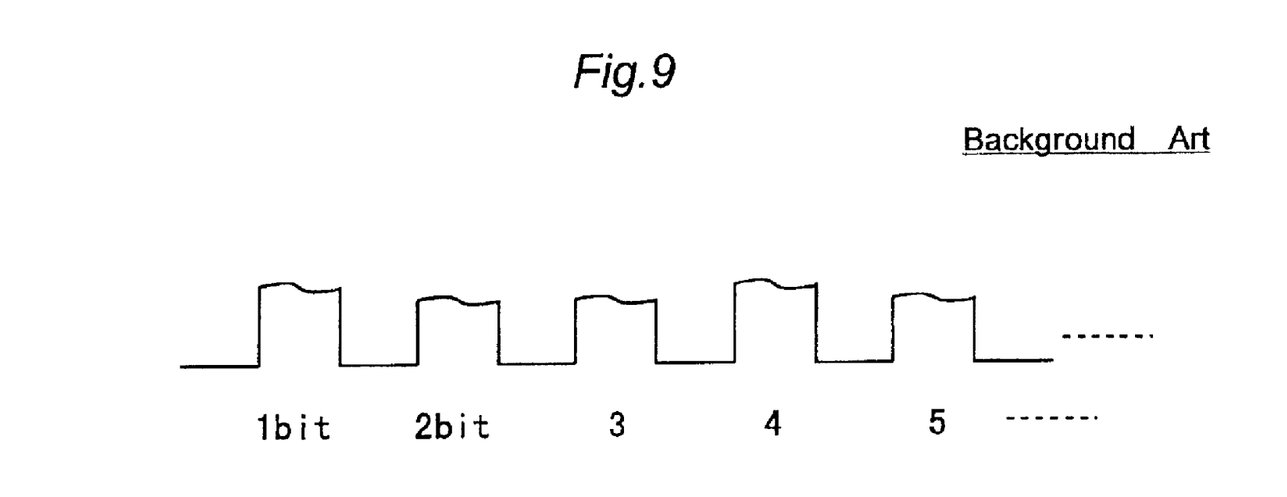
FIG. 9 shows a waveform of an output signal of the conventional line sensor IC.

Further, where a line sensor IC is formed by arranging sensors of FIG. 7 adjacent to each other at a constant pitch, outputs of the respective sensors, that is, respective bits, vary as shown in FIG. 9 because of dispersion of the area of the n⁺ sensor portion 13 and the depletion layer 14 of the sensor. Such dispersion occurs in the following manner. When ion implantation is performed on the substrate 10 to form the n⁺ sensor portion 13 and the depletion layer 14, the implantation area is defined by the LOCOS layer 11 and the polysilicon layer 12. The shape of the LOCOS layer 11 tends to vary in its formation process, as a result of which the area of the n⁺ sensor portion 13 becomes unstable and hence the characteristics of the n⁺ sensor portion 13 and the depletion layer 14 become unstable, resulting in a sensor-by-sensor variation of the electromotive force.

SUMMARY OF THE INVENTION

The present invention has been made to solve the above problems in the art, and an object of the invention is therefore to provide an image sensor having uniform output levels of red, green, and blue, and having high sensitivity and small dispersion in the electromotive force of the sensor element.

According to one aspect of the present invention, an image sensor comprises a plurality of light sources for illuminating light beams of red, green, and blue to a surface of a document. An optical system is provided for condensing reflected light reflected from the document surface. A plurality of sensors are provided in an image formation section of the optical system, and read an image of the document. A reading device is provided for scanning the sensors at a predetermined cycle in synchronism of lighting of the light sources. Thus, an image information is read out as serial electrical signals corresponding to each wavelength of the light sources.

According to another aspect of the present invention, an image sensor comprises at least a light source for applying light to a surface of a document. An optical system is provided for condensing reflected light reflected from the document surface. A plurality of sensors are provided in an image formation section of the optical system. The sensors read an image of the document. Further, each of the sensors comprises a semiconductor substrate. A first polysilicon layer and a LOCOS layer are formed on the semiconductor substrate so as to be separated from each other. A second polysilicon layer is provided on a surface of the LOCOS layer and covers the periphery of the LOCOS layer. A sensor portion is formed by implanting an impurity into the semiconductor substrate between the first and second polysilicon layers. Thus, a reading device scans the sensors at a predetermined cycle.

Other and further objects, features and advantages of the invention will appear more fully from the following description.

DETAILED DESCRIPTION OF THE PREFERRED EMBODIMENTS

First Embodiment

A first embodiment of the present invention will be described below with reference to FIGS. 1A, 1B and 2.

Figure 1A:
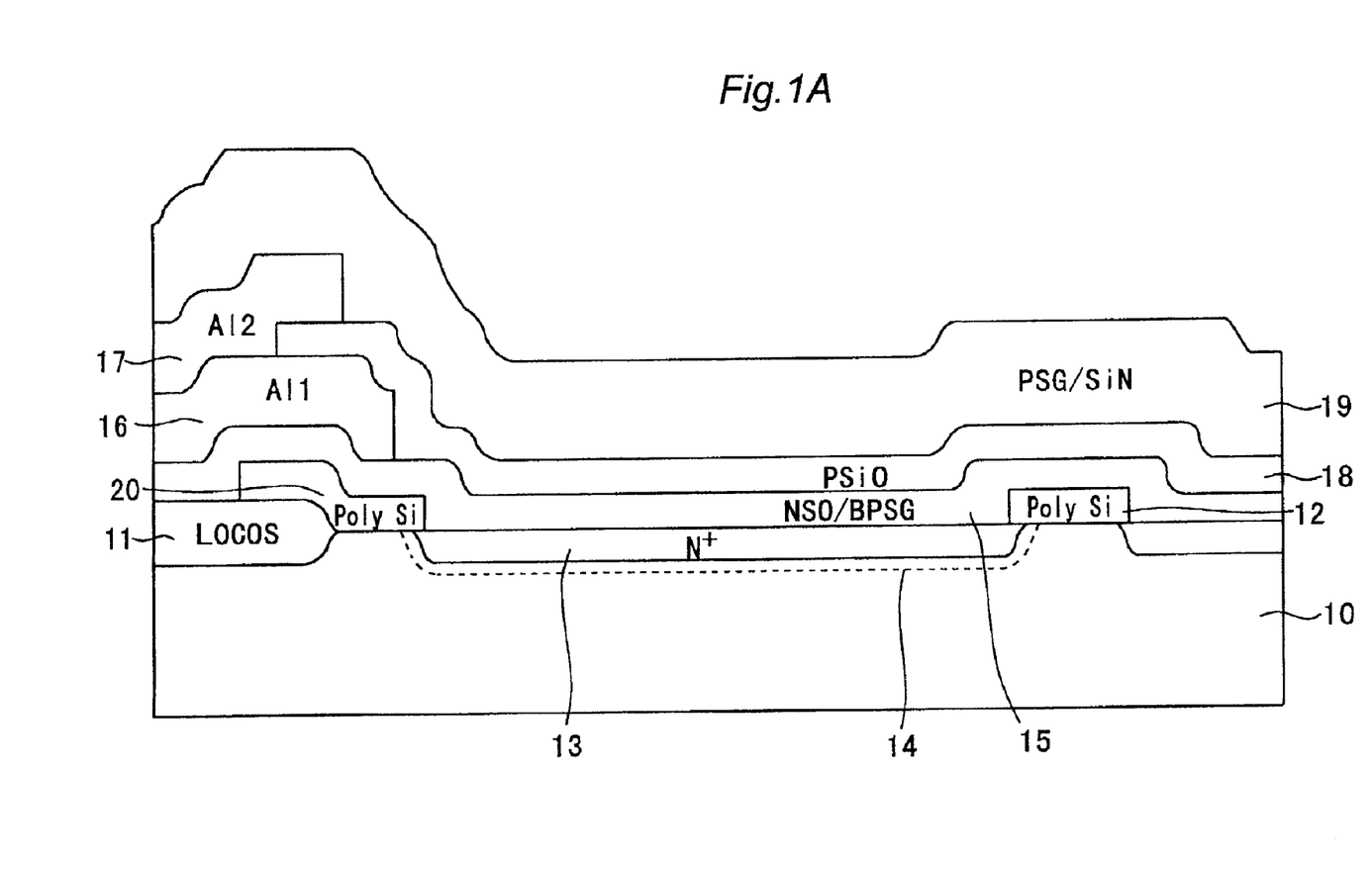
FIG. 1A is a sectional view showing a structure of a line sensor IC according to a first embodiment of the present invention.
Figure 2:
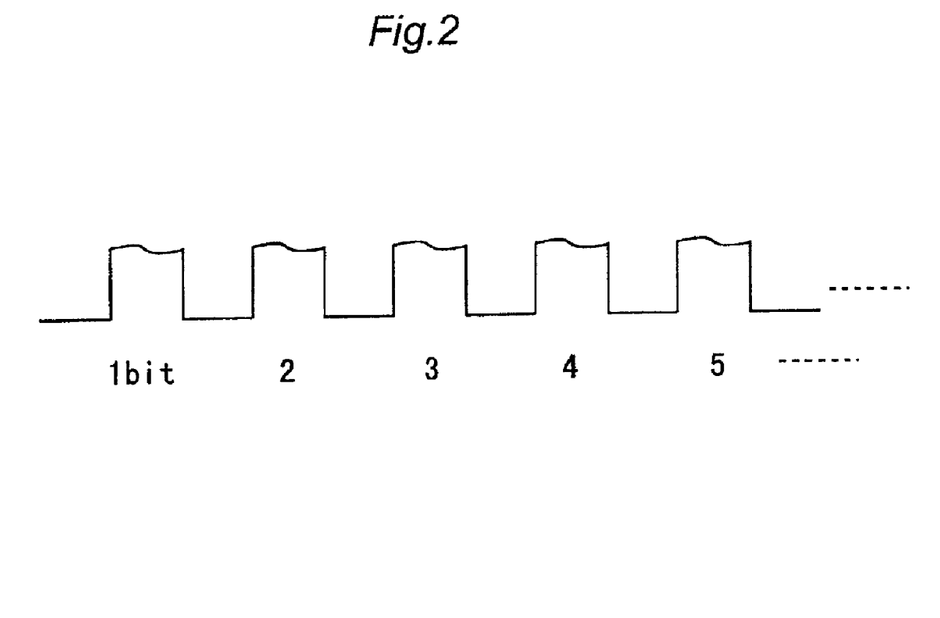
FIG. 2 shows a waveform of an output signal of the line sensor IC of the present invention.

FIG. 1A is a sectional view showing a structure of a line sensor IC according to a first embodiment of the present invention. In FIG. 1A, reference numeral 10 denotes a p-type semiconductor substrate; 11, a LOCOS layer formed locally on the semiconductor substrate 10; 12, a polysilicon layer formed on the semiconductor substrate 10 so as to be separated from the LOCOS layer 11; 20, another polysilicon layer provided on the top surface of the LOCOS layer 11 to cover part of the LOCOS layer 11 and having one end portion (right end portion in FIG. 1A) that extends toward the polysilicon layer 12; 13, a $n^+$ sensor portion formed by implanting a n-type impurity into a portion of the substrate 10 that is located between the polysilicon layer 12 and another polysilicon layer 20; and 14, a depletion layer formed along the $n^+$ sensor portion 13. The depletion layer 14 includes space charge and gives rise to a resulting strong electric field.

Reference numeral 15 denotes a silicon borate/phosphate film (NSO/BPSG oxide film) formed on the top surfaces of the polysilicon layers 12 and another polysilicon layers 20 and the $n^+$ sensor portion 13 so as to cover those layers; 16, a first aluminum interconnection layer formed on part of the top surface of the silicon borate/phosphate film 15; 17, a second aluminum interconnection layer formed on the top surface of the first aluminum interconnection layer 16; 18, a plasma silicon oxide film (PSiO film) formed on the top surfaces of the silicon borate/phosphate film 15 and the first aluminum interconnection layer 16; and 19, a protective film that is a silicon nitride film (PSG/SiN film) formed on the top surface of the plasma silicon oxide film 18 and the second aluminum interconnection layer 17.

Figure 1B:
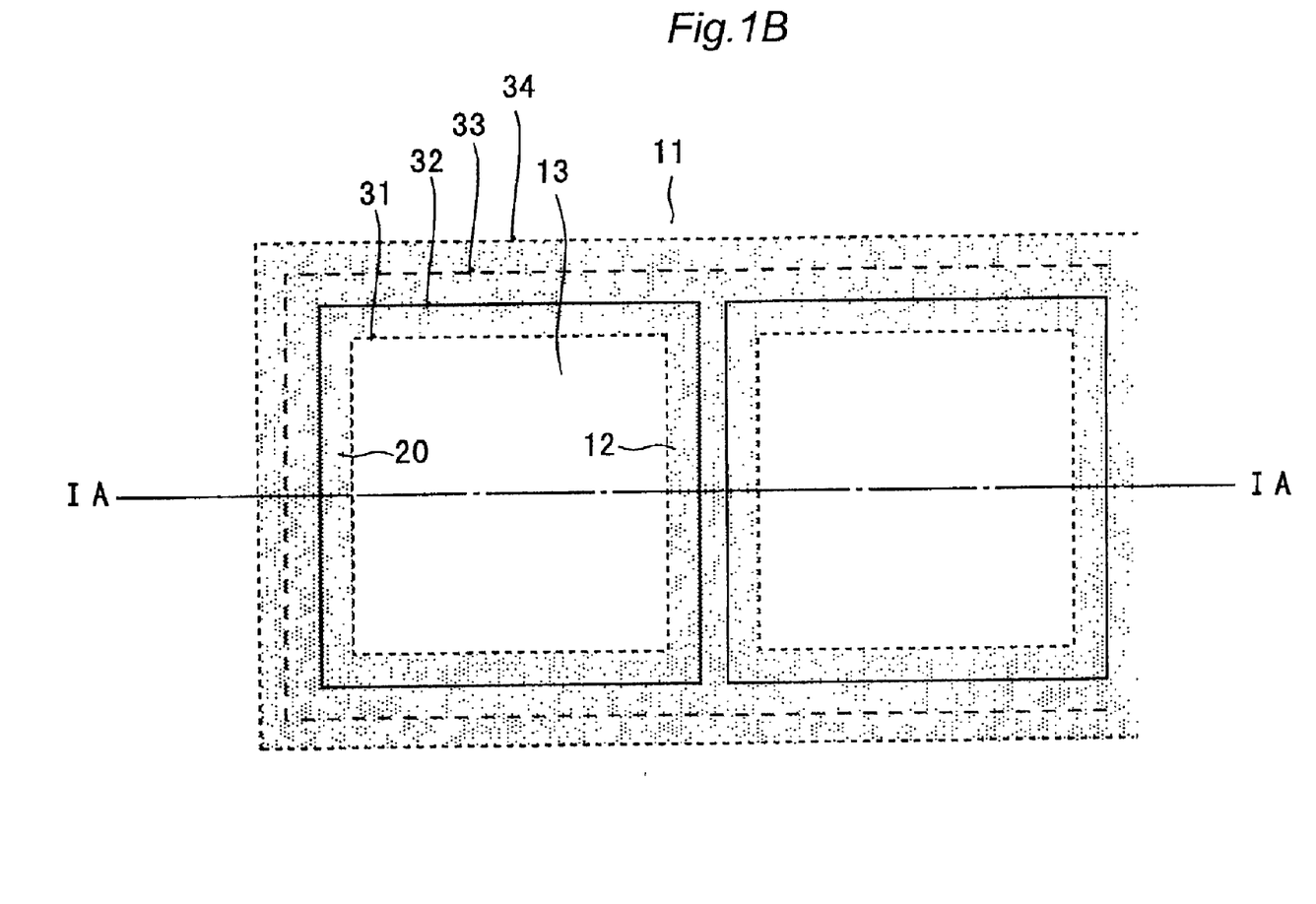
FIG. 1B is a plan view showing a structure of a line sensor IC shown by FIG. 1A.

FIG. 1B is a plan view showing a structure of a line sensor IC shown by FIG. 1A. FIG. 1A is a cross sectional view at line IA—IA in FIG. 1B. In FIG. 1B, reference numeral 13 is a $n^+$ sensor portion and corresponds to a rectangular region encircled by a solid line 32. Reference numeral 11 is a LOCOS layer and extends outward from the dotted line 33. Reference numeral 12 is a polysilicon layer shown in FIG. 1A, and reference numeral 20 is another polysilicon layer shown in FIG. 1A. The polisilicon layer 12, 20 seems to be separated in FIG. 1A, however these layer are actually in continuation and correspond to a rectangular circular region sandwiched by dotted lines 31 and 34. This polisilicon layer 12, 20 covers a circular region on both sides of the outer periphery of the $n^+$ sensor portion 13 indicated by solid line 32. Since defects are apt to be caused and abnormal sensitivity is brought about at the periphery portion of the $n^+$ sensor portion 13, that area is covered by the polisilicon layer 12, 20 to cut incident light. The LOCOS layer 11 is disposed to surround $n^+$ sensor portion 13 for separation from other regions.

In this embodiment, the area of the $n^+$ sensor portion 13 and the depletion layer 14 is defined by the polysilicon layer 12 and another polysilicon layer 20. The formation process of the polysilicon layer is more stable than that of the LOCOS layer, and hence the polysilicon layer is superior in shape stability to the LOCOS film. Therefore, the area of the region surrounded by the polysilicon layers 12 and 20 is made stable. The area of the $n^+$ sensor portion 13 that is formed by implanting $n^+$ ions into such a region is also made stable. As a result, an output signal of the line sensor IC becomes approximately uniform as shown in FIG. 2.

Second Embodiment

Next, a second embodiment of the present invention will be described.

In this embodiment, the thickness of the protective film 19 is set at 2,000 Å or less.

Where the thickness of the protective film 19 is reduced in this manner, undulations in the transmission spectrum due to interference of incident light are made small and the degrees of light absorption at the respective wavelengths of red, green, and blue are decreased. As a result, color-related variations among sensor outputs are reduced.

Figure 3:
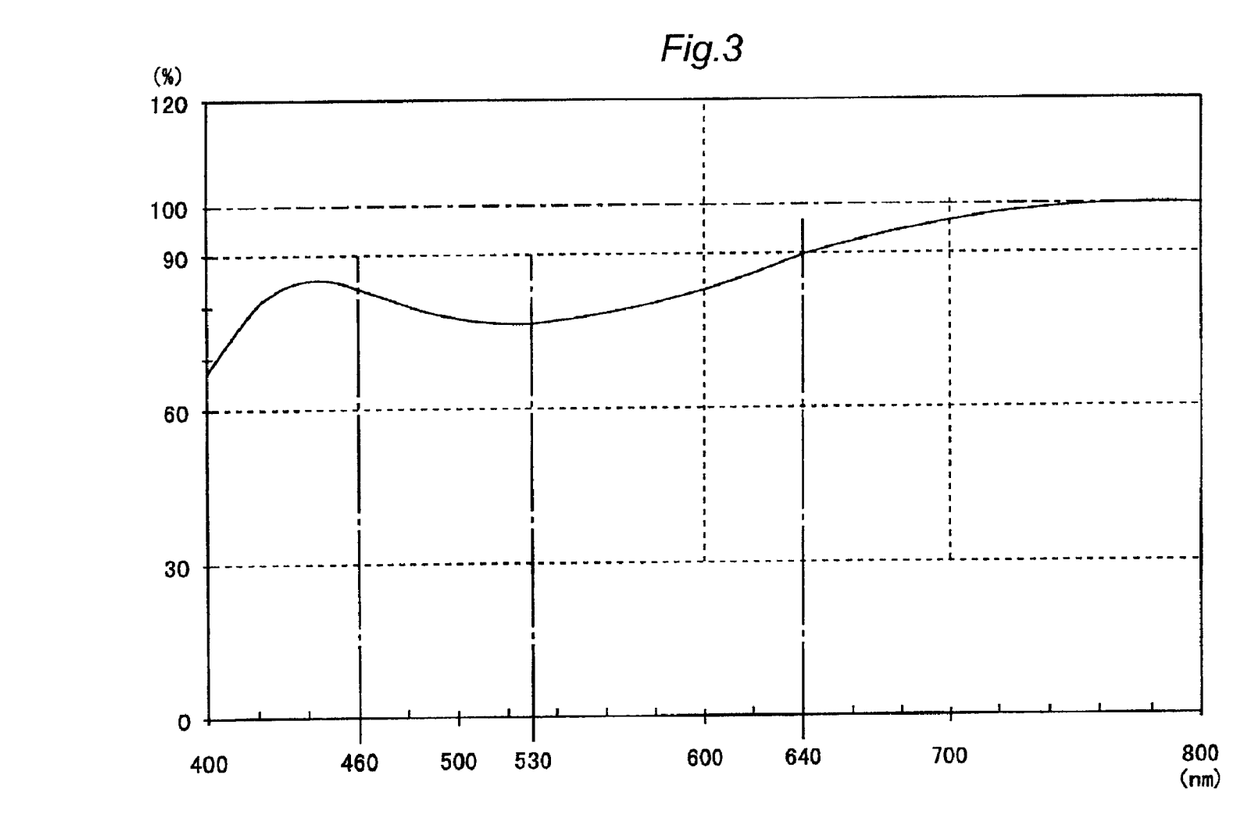
FIG. 3 shows a transmission spectrum of a protective film according to a second embodiment of the invention.

FIG. 3 shows a transmission spectrum of the protective film 19 having such a thickness.

As in the case of FIG. 8, the horizontal axis represents the wavelength and the vertical axis represents the transmittance.

As seen from FIG. 3, transmittance values at wavelengths 460 nm, 530 nm, and 640 nm are about 85%, about 75%, and about 90%, respectively. Undulations in the spectrum are small in this embodiment. This is in contrast to the spectrum of FIG. 8 of the conventional protective film having the thickness of 8,000 Å in which large undulations exist and transmittance values at the above wavelengths are about 65%, about 85%, and about 100%, respectively. This is because the thinning of the protective film 19 decreases the influences of light interference.

FIG. 5E shows an output signal of a line sensor IC according to the second embodiment. As seen from FIG. 5E, variations among outputs of red, green, and blue are reduced.

Third Embodiment

Next, a third embodiment of the invention will be described.

In the second embodiment, sensor output variation among colors is reduced by decreasing the thickness of the protective film 19 to 2,000 Å or less. In this third embodiment, instead of decreasing the thickness of the protective film 19, the protective film 19 is so formed as to have superior UV transmission characteristic. Namely, the concentration of Si—H bonds is made relatively lower than that of N—H bonds in the protective film 19, to make the degree of absorption in a short wavelength range lower than in the conventional protective film 19,.

With this measure, the degree of light absorption in the short wavelength range is lowered and hence the transmittance is increased in a wavelength range around 460 nm. As a result, variations among outputs of the three respective colors are reduced and the same advantages as in the second embodiment are obtained.

Fourth Embodiment

Next, a fourth embodiment of the present invention will be described.

The difference between the refractive indices of the protective film 19 and the plasma silicon oxide film (Psio film) 18 causes undulations in the transmission spectrum due to light interference. In view of this, in this fourth embodiment, a silicon nitride film or the like, whose refractive index is somewhere between the refractive indices of the protective film 19 and the plasma silicon oxide film (PSiO film) 18, is formed, between the protective film 19 and the plasma silicon oxide film 18, to a thickness (e.g., 10 nm) not to influence the light transmission. As a result, undulations are made small and the transmittance is increased, whereby the same advantages as in the above embodiments can be obtained.

Fifth Embodiment

Next, a fifth embodiment of the present invention will be described.

The transmission spectrum of FIG. 8 of the conventional protective film 19 having the thickness of 8,000 Å has transmittance peaks near the wavelengths of the red, green, and blue light sources; specifically, the peaks are located at 640 nm (red), 545 nm (green), and 480 nm (blue).

Local maximum transmittance values exist at these three wavelengths, and the maximum/minimum difference of the transmittance is about 15%. Comparisons with cases where other wavelengths are selected as the wavelengths of the light sources of the three colors show that the above wavelengths are the best points in terms of the transmittance values and the variations.

In view of the above, in this fifth embodiment, the wavelengths of the red, green, and blue light sources are set at 640 nm, 545 nm, and 480 nm, respectively.

This measure reduces light-source-related variations among outputs, whereby the same advantages as in the case where the thickness of the protective film 19 is set at 2,000 Å or less (see FIG. 5E) can be expected.

The features and advantages of the present invention as described above may be summarized as follows.

According to one aspect of the present invention, the wavelengths of the red, green, and blue light sources are set at 640 nm, 545 nm, and 480 nm, respectively. Therefore, light-source-related variations among outputs are reduced, whereby a high-sensitivity image sensor can be obtained.

According to another aspect of the invention, the impurity implantation region to become the sensor portion is defined by the polysilicon layer provided on the top surface of the LOCOS layer and another polysilicon layer formed so as to be separated from the LOCOS layer. Therefore, the area of the impurity implantation region is made stable, whereby an output signal of each color can be made uniform. Further, utilization of these advantages makes it possible to use the image sensor as a monochromatic image sensor.

According to another aspect of the invention, the thickness of the protective film of the sensors is set at 2,000 Å or less. Therefore, undulations in the transmission spectrum due to interference of incident light are reduced and the degrees of light absorption at the wavelengths of the respective color are lowered. As a result, color-related variations among sensor outputs are reduced.

According to another aspect of the invention, the protective film of the sensors is formed in such a manner that the concentration of Si—H bonds is lower relatively than that of N—H bonds. Therefore, the degree of light absorption is decreased in a short wavelength range and hence the transmittance increases in a blue wavelength range. As a result, variations among output signals of the respective colors can be reduced.

According to another aspect of the invention, the silicon nitride film whose refractive index is somewhere between the refractive indices of the sensor protective film and the plasma silicon oxide film (PSiO film) is provided between those films. Therefore, undulations in the transmission spectrum due to interference of light are reduced and the transmittance is increased, whereby a high-sensitivity image sensor can be obtained.

Obviously many modifications and variations of the present invention are possible in the light of the above teachings. It is therefore to be understood that within the scope of the appended claims the invention may by practiced otherwise than as specifically described. The entire disclosure of a Japanese patent application no. 11-317061, filed on Nov. 8, 1999 including specification, claims, drawings and summary, on which the convention priority of the present application is based, are incorporated herein by reference in its entirety.

What is claimed is:

1. An image sensor system, comprising:

a plurality of light sources for illuminating a document surface with light beams of red, green, and blue respectively having a wave length substantially equal to 480 nm, 545 nm, and 640 nm;

an optical system for condensing light reflected fromsaid surface of said document;

a plurality of light sensors provided in an image formation section of said optical system and detecting condensed light from said optical system, said plurality of light sensors being provided for reading an image of said document by outputting electrical signals corresponding to detected light from said optical system; and a reading device for receiving electrical signals from said plurality of light sensors at a predetermined cycle in synchronism with lighting of said plurality of light sources to thereby receive image information of said document, wherein said image information of said document is read out from said reading device as serial electrical signals corresponding to each wavelength of said plurality of light sources.

* * * * *